US006925621B2

(12) United States Patent
Mielke et al.

(10) Patent No.: US 6,925,621 B2
(45) Date of Patent: Aug. 2, 2005

(54) SYSTEM AND METHOD FOR APPLYING TIMING MODELS IN A STATIC-TIMING ANALYSIS OF A HIERARCHICAL INTEGRATED CIRCUIT DESIGN

(75) Inventors: David James Mielke, Fort Collins, CO (US); Dennis B. Batchelor, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/178,604

(22) Filed: Jun. 24, 2002

(65) Prior Publication Data

US 2003/0237067 A1 Dec. 25, 2003

(51) Int. Cl.[7] ................................................. G06F 9/45
(52) U.S. Cl. ................................... 716/6; 716/4; 716/5
(58) Field of Search ........................... 716/2, 4–6, 18; 703/19, 26; 709/230–232

(56) References Cited

U.S. PATENT DOCUMENTS

| | | | | |
|---|---|---|---|---|
| 5,452,239 A | * | 9/1995 | Dai et al. | 703/19 |
| 5,581,473 A | * | 12/1996 | Rusu et al. | 716/6 |
| 5,812,416 A | * | 9/1998 | Gupte et al. | 716/2 |
| 5,867,399 A | * | 2/1999 | Rostoker et al. | 716/18 |
| 5,983,277 A | * | 11/1999 | Heile et al. | 709/232 |
| 6,058,252 A | * | 5/2000 | Noll et al. | 716/10 |
| 6,298,319 B1 | * | 10/2001 | Heile et al. | 703/26 |
| 6,470,482 B1 | * | 10/2002 | Rostoker et al. | 716/6 |
| 6,496,965 B1 | * | 12/2002 | van Ginneken et al. | 716/10 |
| 6,567,967 B2 | * | 5/2003 | Greidinger et al. | 716/10 |
| 6,629,293 B2 | * | 9/2003 | Chang et al. | 716/4 |
| 6,795,951 B2 | * | 9/2004 | Hathaway et al. | 716/5 |
| 2002/0073380 A1 | * | 6/2002 | Cooke et al. | 716/1 |
| 2002/0147951 A1 | * | 10/2002 | Nadeau-Dostie et al. | 714/731 |
| 2003/0115564 A1 | * | 6/2003 | Chang et al. | 716/8 |
| 2003/0121013 A1 | * | 6/2003 | Moon et al. | 716/6 |
| 2003/0212974 A1 | * | 11/2003 | Frerichs | 716/8 |

* cited by examiner

*Primary Examiner*—Vuthe Siek
*Assistant Examiner*—Naum B. Levin

(57) ABSTRACT

A system and method for automating a static-timing analysis of an integrated circuit design are provided. A representative system includes a network coupled to a plurality of data storage devices, the data storage devices containing a knowledge base that defines an integrated circuit design; a computer coupled to the network, the computer including logic for receiving information defining an integrated circuit representation from the plurality of data storage devices; and a memory element associated with the computer, the memory element configured to store logic, the logic configured to generate static-timing scripts that reflect a plurality of timing models. A representative method includes the following steps: acquiring circuit information, the circuit information comprising a plurality of functional blocks; identifying a timing model to apply to each of the plurality of functional blocks; defining the hierarchical relationships between each of the plurality of functional blocks; extracting the circuit information responsive to the identifying and defining steps to complete a simulation of each of the plurality of functional blocks; and forwarding the simulation to a static-timing engine.

36 Claims, 8 Drawing Sheets

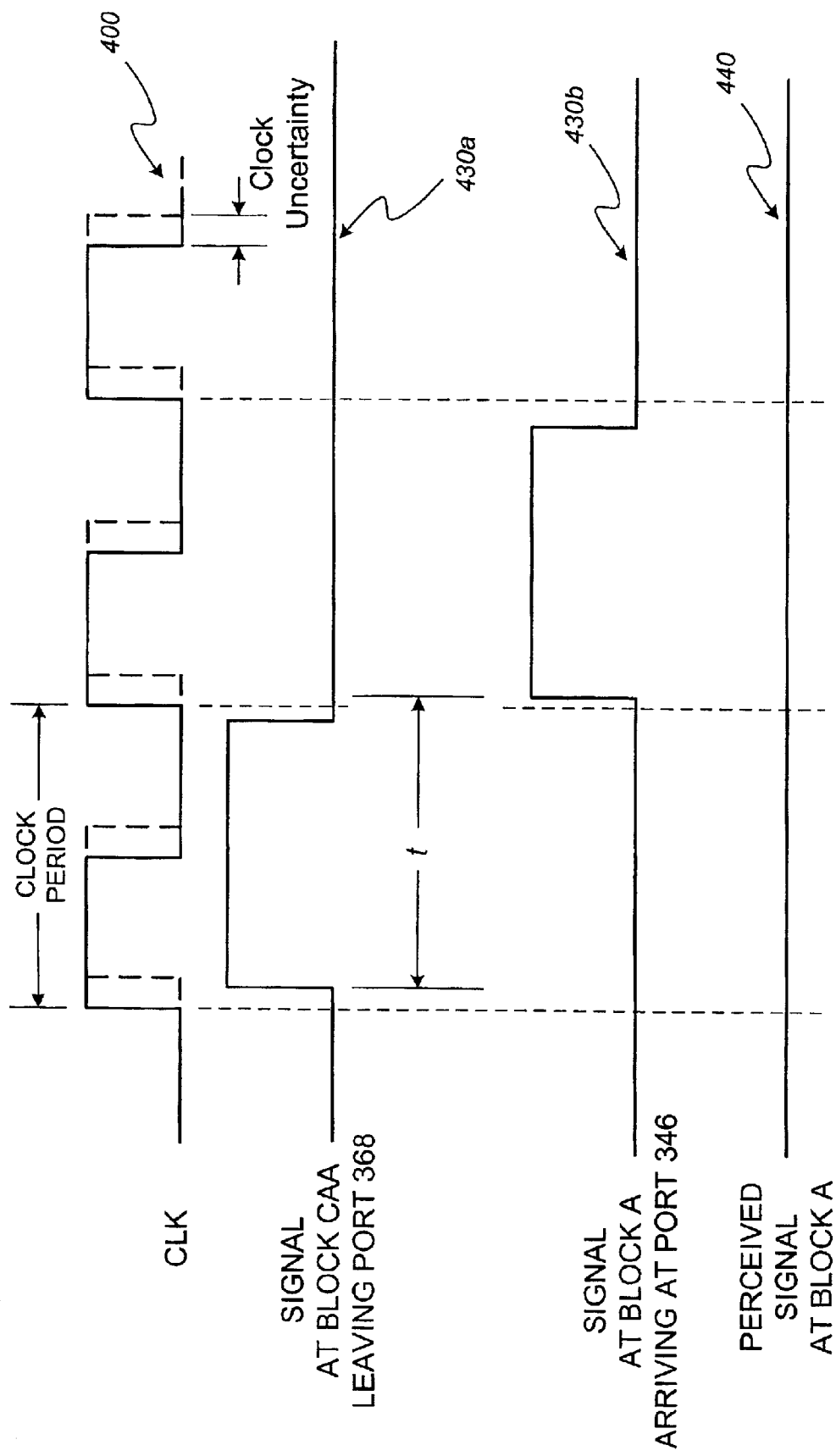

SYSTEM AND METHOD FOR APPLYING TIMING MODELS IN A STATIC-TIMING ANALYSIS OF A HIERARCHICAL INTEGRATED CIRCUIT DESIGN

TECHNICAL FIELD

The present invention generally relates to computer-aided integrated circuit design systems, and more particularly to a system and method for performing a static-timing analysis of an integrated circuit design.

BACKGROUND OF THE INVENTION

Integrated circuits are electrical circuits that arrange transistors, resistors, capacitors, and other components on a single semiconductor die or substrate, upon which the various components are interconnected to perform a variety of functions. Typical examples of integrated circuits include, for example, microprocessors, programmable-logic devices (PLDs), electrically-erasable-programmable-read-only memory devices (EEPROMs), random-access-memory (RAM) devices, operational amplifiers, voltage regulators, etc.

Often, circuit designs are simulated by computer to verify functionality and timing to ensure that performance goals will be satisfied. Design and circuit analysis procedures are often performed using electronic-computer-aided design (E-CAD) tools. The design and subsequent simulation of a printed circuit, a very large scale integration (VLSI) circuit, or other electrical devices via E-CAD tools allows a product design to be confirmed, and often eliminates the need for building a prototype. Thus, E-CAD tools may enable a VLSI circuit manufacturer to bypass costly and time consuming prototype construction and performance verification stages in the product development process.

A VLSI circuit design can be represented at different levels of abstraction using a hardware description language. Some hardware description languages support circuit description at a register-transfer level, as well as at a logic level. At any abstraction level, a circuit design may be specified using behavioral or structural descriptions, or a combination of both. A behavioral description is often specified using Boolean functions. A structural description may include a list describing the various connections in a network of primitive or higher-level cells. Such a list is often called a "netlist." The netlist may be used by logic synthesizers, circuit simulators, and other circuit design optimization tools to model the circuit. Examples of primitive cells are, among others, full-adders, logic gates, latches, and flip-flops. A register is an example of a higher-level (i.e., a non-primitive) cell.

A number of known systems use information provided in netlists to evaluate circuit timing and other related parameters. Although the operational specifics vary from system to system, such systems generally operate by identifying certain critical timing paths, modeling the conductors and the various cells defining each critical timing path using a resistor-capacitor (RC) network, and then evaluating the circuit to determine whether timing violations occur for signals required to traverse each of the critical paths. Static-timing tools, which are a specific type of optimization tool, are used to confirm that received input signals will arrive in time for the receiving block to process the signals, and confirm that block output signals will reach their designated destination circuits before the next clock cycle. Static-timing tools are designed with a focus on cell to cell (e.g., register to register) travel time estimates.

Unfortunately, this cell to cell approach is not well suited to convey useful and accurate timing information in the early design stages of a VLSI circuit design. First, VLSI circuits are commonly designed by circuit design teams. Each circuit designer, or a team of circuit designers, is assigned to create the circuits that will be used in one or more functional areas or blocks across the die that will contain the entire circuit. In the final product, each of the separately designed functional blocks must function correctly over time while receiving input signals and sending output signals across functional block interfaces. This functional block by functional block design approach can lead to circuit timing flaws that may not be identified until the functional blocks are integrated.

In addition, these block level interface-timing problems worsen as clock signal frequency increases. As the clock signal frequency increases, the corresponding shorter clock cycles increase the relative impact of signal transfer delays between an interface of a functional block and the various circuit components (e.g., registers) contained within respective blocks. Thus, static-timing tools designed with the intention of confirming a circuit design are not well suited to generate timing information that can be communicated to the designers of each of the functional blocks before they finalize the details of their assigned block circuit designs. Moreover, static-timing tools do not provide a mechanism to convey block level to block level timing information for a hierarchically arranged integrated circuit.

In addition to the above mentioned shortcomings of conventional static-timing tools, increases in integrated circuit density and complexity have led to an increase in memory requirements and test run times. Early test cases designed to simulate the operation and signal-timing verification of the latest generation of integrated circuits can require many days or weeks to perform a static-timing analysis over the entire integrated circuit.

Techniques and methods adopted in an attempt to reduce the memory requirements and run times to perform static-timing tests for integrated circuit designs rely on the tester's knowledge of both integrated circuit design and the static-timing process. Moreover, these techniques and methods require a great deal of manual intervention, resulting in techniques and methods that are error prone and time consuming.

In light of competitive pressures to design functional VLSI circuits with confidence that functional blocks will operate as desired over time, while reducing the design life cycle and development costs, there is a need for a system and method that addresses these and/or other shortcomings of the prior art, while providing a functional VLSI circuit design.

SUMMARY OF THE INVENTION

The system and method of the present invention relates to automating the process of collecting and formatting information from an integrated circuit design knowledge base that can be forwarded to a static-timing engine to analyze the integrated circuit. The process adapts to collect and format that information used to simulate functional blocks within the integrated circuit design in response to interchangeable and selectable timing models. Timing models reduce the complexity of the integrated circuit representation by removing timing arcs from the design. These timing models allow the static-timing analysis to be completed in less time using less memory than would otherwise be possible.

The system and method of the present invention generate static-timing scripts (i.e., data files), as well as a static-timing run script that directs the operation and output content of a static-timing analysis of the integrated circuit. A representative system includes a network coupled to a plurality of data storage devices, the data storage devices containing a knowledge base that defines an integrated circuit design; a computer; and a memory element associated with the computer, the memory element configured to store logic, the logic configured to generate static-timing scripts that reflect a plurality of timing models.

A representative method includes the following steps: acquiring circuit information, the circuit information comprising a plurality of functional blocks; identifying a timing model to apply to each of the plurality of functional blocks; defining the hierarchical relationships between each of the plurality of functional blocks; extracting the circuit information responsive to the identifying and defining steps to complete a simulation of each of the plurality of functional blocks; and forwarding the simulation to a static-timing engine.

Other systems, methods, and features of the present invention will be or become apparent to one skilled in the art upon examination of the following drawings and detailed description. It is intended that all such additional systems, methods, and features are included within this description, are within the scope of the present invention, and are protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIGS. 4A and 4B are schematic representations of clock and data signals from the integrated circuit of FIG. 3.

DETAILED DESCRIPTION OF THE PREFERRED EMBODIMENT

Figure 1:
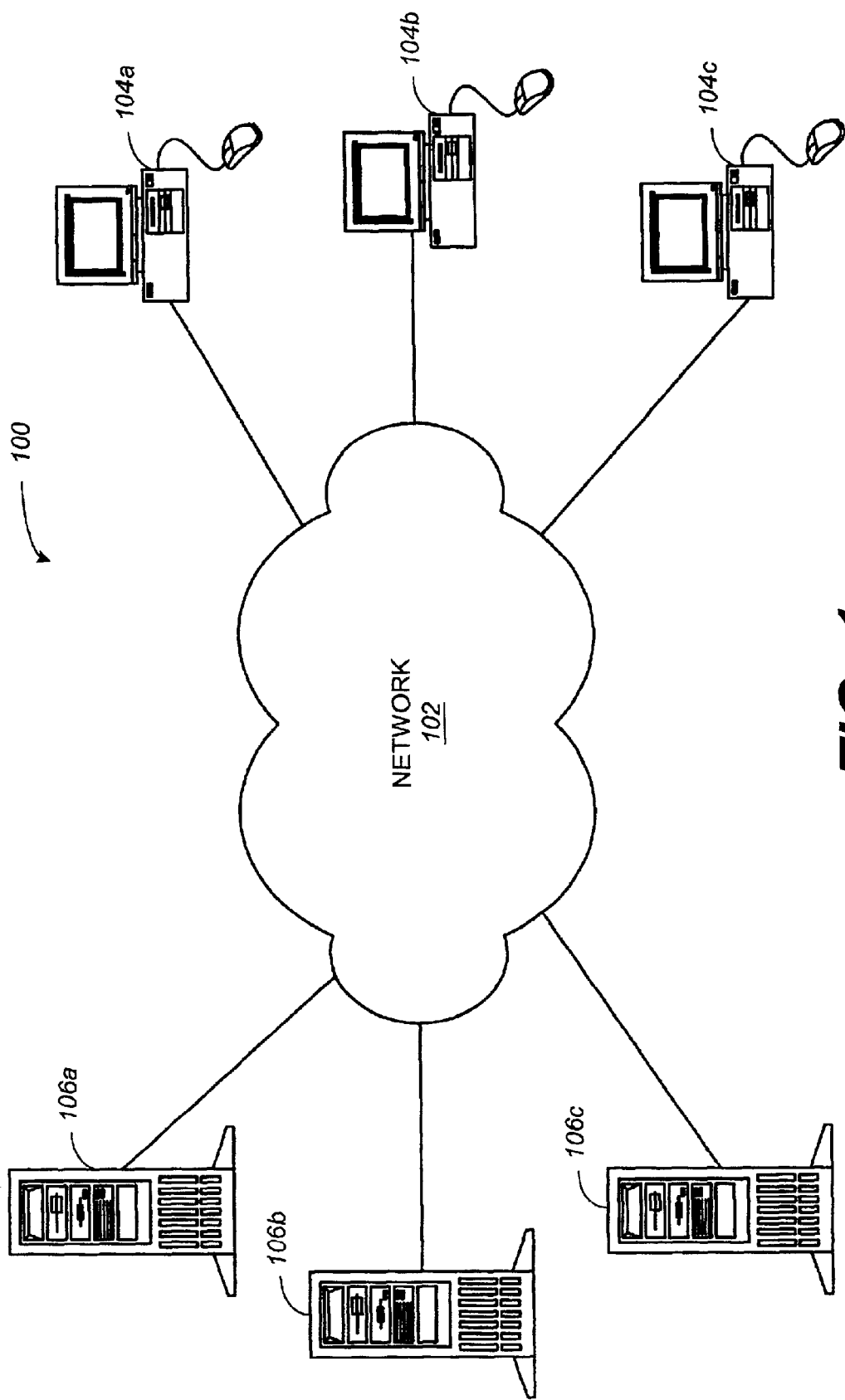
FIG. 1 is a schematic diagram of an integrated circuit design system that can be used to store and apply embodiments of the invention.

Referring now in more detail to the drawings, in which like numerals indicate corresponding parts throughout the several views, FIG. 1 illustrates an integrated circuit design system 100 for sharing data. As indicated in this figure, the system 100 can comprise one or more computing devices 104 that are each connected to each other via a network 102. As suggested by FIG. 1, the computing devices 104 can be workstations, personal computers (PCs) such as desktop computers, laptop computers, among others.

The network 102 can comprise one or more networks that are communicatively coupled. The networks can include, for example, a local area network (LAN) and/or a wide area network (WAN). In a preferred arrangement, the network 102 is a LAN. The system 100 also includes a number of file servers 106. Each of the file servers 106 stores data and integrated circuit design and analysis applications. As indicated in FIG. 1, each of the file servers 106 is connected to the network 102 such that integrated circuit designers can perform design and analysis operations on an integrated circuit from any of the computing devices 104.

The distributed nature of the system 100 enables a collaborative design effort from a plurality of individual circuit designers or design teams. Generally, integrated circuit design teams are assigned to generate small functional blocks (e.g., logic circuits) that each perform a specific function. As each functional block is created, a representation of the proposed circuit can be stored in a designated memory location accessible via the network 102. Storing functional blocks in accessible memory locations provides a mechanism for design reuse in other portions of the integrated circuit. In addition, storing representations of the functional blocks in accessible memory locations allows any individual designer with the appropriate access authority the capability to formulate and direct a customized analysis of the integrated circuit design. It should be understood that these customized analyses can be performed throughout the development process.

Figure 2:
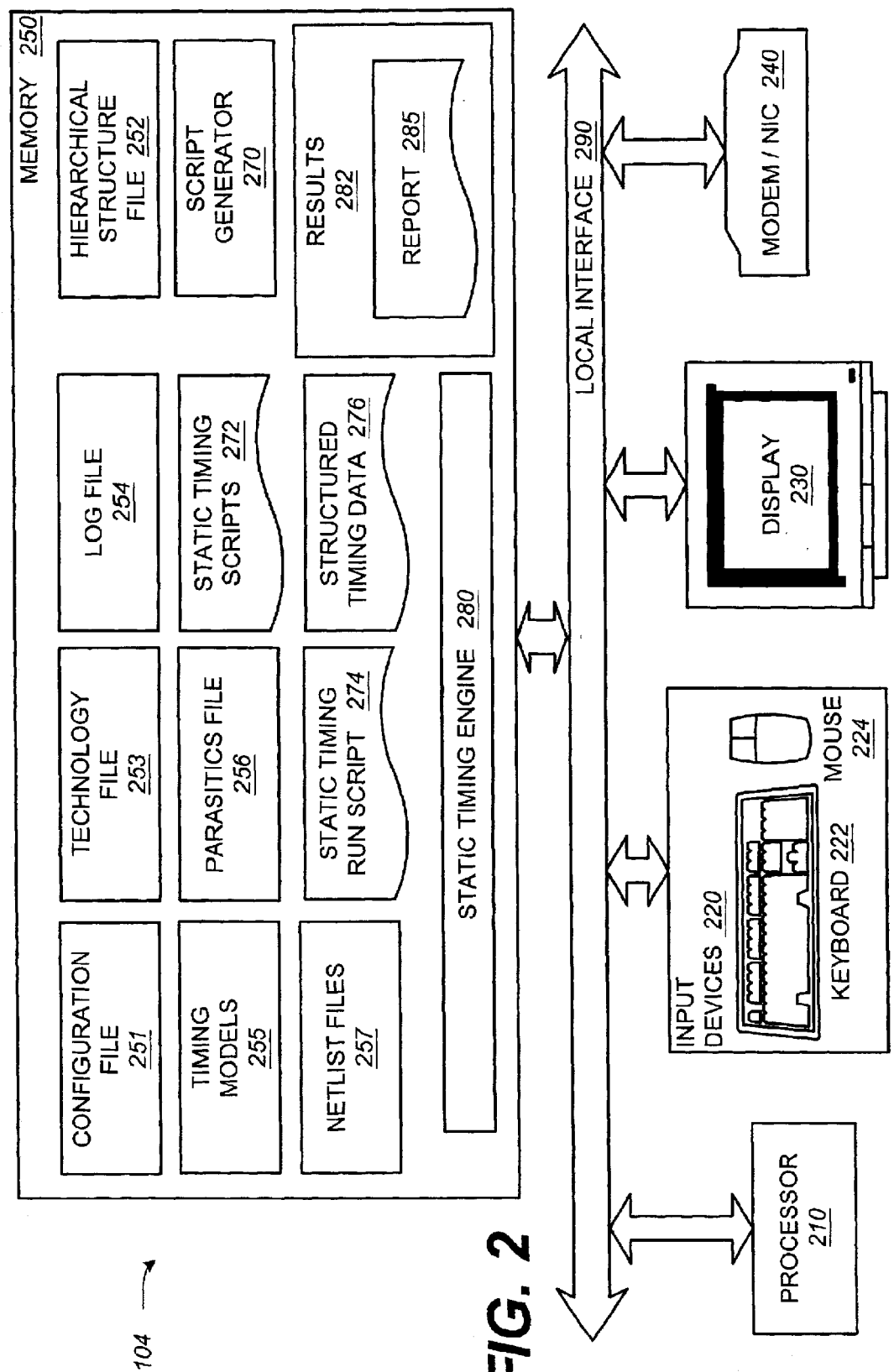
FIG. 2 is a block diagram illustrating an embodiment of a general-purpose computer of the integrated circuit design system of FIG. 1.

FIG. 2 presents a block diagram illustrating an embodiment of a computing device 104 that may be used to analyze clock and signal-timing relationships over various conductors within an integrated circuit representation. In this regard, the computing device 104 may include a processor 210, input devices 220, a display device 230, a network interface device 240, and a memory 250 that communicate with each other via a local interface 290. The local interface 290 can be, but is not limited to, one or more buses or other wired or wireless connections as is known in the art. The local interface 290 may include additional elements, such as buffers (caches), drivers, and controllers (omitted here for simplicity), to enable communications. Further, the local interface 290 includes address, control, and data connections to enable appropriate communications among the aforementioned components.

The processor 210 is a hardware device for executing software stored in memory 250. The processor 210 can be any custom made or commercially available processor, a central processing unit (CPU) or an auxiliary processor associated with the computing device 104, or a semiconductor based microprocessor (in the form of a microchip) or a macroprocessor. Examples of suitable commercially available microprocessors are as follows: a precision architecture reduced instruction set computing (PA-RISC) series microprocessor from Hewlett-Packard Company, an 80x86 or Pentium series microprocessor from Intel Corporation, a PowerPC microprocessor from IBM, a Sparc microprocessor from Sun Microsystems, Inc, or a 68xxx series microprocessor from Motorola Corporation.

The input devices 220 may include, but are not limited to, a keyboard 222, a mouse 224, or other interactive pointing devices, voice activated interfaces, or other suitable operator-machine interfaces (omitted for simplicity of illustration). The input devices 220 can also take the form of an image acquisition device (e.g., a scanner) or a data file transfer device (i.e., a floppy disk drive (not shown)). Each of the various input devices 220 may be in communication with the processor 210 and/or the memory 250 via the local interface 290. Data received from an image acquisition device connected as an input device 220 or via the network interface device 240 may take the form of an image, a flat file, a database, or other various information transfer methodologies in addition to the aforementioned operator commands.

The display device 230 may include a video interface that supplies a video output signal to a display monitor associated with the computing device 104. The display device(s) that can be associated with the computing device 104 can be conventional CRT based displays, liquid crystal displays (LCDs), plasma displays, or other display types. It should be understood, that various output devices (not shown) may also be integrated via local interface 290 and/or via network interface device 240 to other well-known devices such as plotters, printers, etc.

Local interface 290 may also be in communication with input/output devices that connect the computing device 104 to a network 102 (FIG. 1). These two-way communication devices include, but are not limited to, modulators/demodulators (modems), network interface cards (NIC), radio frequency (RF) or other transceivers, telephonic interfaces, bridges, and routers. For simplicity of illustration, such two-way communication devices are represented by modem/NIC 240.

The memory 250 can include any one or combination of volatile memory elements (e.g., random-access memory (RAM, such as dynamic RAM or DRAM, static RAM or SRAM, etc.)) and nonvolatile-memory elements (e.g. read-only memory (ROM), hard drive, tape drive, compact disc (CD-ROM), etc.). Moreover, the memory 250 may incorporate electronic, magnetic, optical, and/or other types of storage media. Note that the memory 250 can have a distributed architecture, where various components are situated remote from one another, such as in the various file servers 106 and other computing devices 104 coupled to the network 102 (FIG. 1) that are accessible via firmware and/or software operable on the processor 210.

The software in memory 250 may include one or more separate programs, files, reports, logs, etc. For example, the memory 250 may include a script generator 270 and a static-timing engine 280. Each of the one or more separate programs will comprise an ordered listing of executable instructions for implementing logical functions. Furthermore, the software in the memory 250 may include a suitable operating system (not shown). A non-exhaustive list of examples of suitable commercially available operating systems is as follows: a Windows operating system from Microsoft Corporation, a Netware operating system available from Novell, Inc., a UNIX operating system, which is available for purchase from many vendors, such as Hewlett-Packard Company and Sun Microsystems, Inc., or a LINUX operating system, which is available from Red Hat, Inc. The operating system essentially controls the execution of other computer programs, such as the static-timing engine 280 and the script generator 270. The operating system provides scheduling, input-output control, file and data management, memory management, and communication control and related services.

It should be understood that the script generator 270 and the static-timing engine 280 can be implemented in software, firmware, hardware, or a combination thereof. The script generator 270, in the present example, can be a source program, executable program (object code), or any other entity comprising a set of instructions to be performed. The static-timing engine 280 can be a commercially available static-timing tool such as PrimeTime®, from Synopsis Inc. of Mountain View, Calif., U.S.A., among others, or a proprietary source program. When in the form of a source program, the script generator 270 and the static-timing engine 280 are translated via a compiler, assembler, interpreter, or the like, which may or may not be included within the memory 250, to operate in connection with the operating system. Furthermore, the script generator 270 and the static-timing engine 280 can be written as (a) an object-oriented programming language, which has classes of data and methods, or (b) a procedure-programming language, which has routines, subroutines, and/or functions, for example but not limited to, C, C++, Pascal, Basic, Fortran, Cobol, PERL, Java, and Ada.

In the representative computing device 104 illustrated in FIG. 2, the memory 250 includes configuration file 251, timing models 255, one or more netlist files 257, technology file 253, and a parasitics file 256, each containing various input information. The static-timing run script 274, log file 254, hierarchical structure file 252, static-timing scripts 272, structured timing data 276, and a results file 282 may also be found and/or generated and stored in memory 250. As shown in FIG. 2, memory 250 may also include a report 285 that may be derived from the results file 282.

It will be understood by those having ordinary skill in the art that the implementation details of the various files and models will differ based on the underlying technology being modeled and the requirements of the particular computer-aided design tools and the static-timing engine 280 integrated with the computing device 104. For example, configuration files 251, timing models 255, netlist files 257, technology files 253, parasitics file 256, as well as the hierarchical structure file 252, log file 254, static-timing scripts 272, the static-timing run script 274, and the structured timing data 276 will differ based on the underlying integrated circuit technology, the computer-aided design tools used to produce the design, and the particular static-timing engine 280.

It will be further understood that the software and/or firmware in memory 250 may also include a basic input output system (BIOS) (not shown). The BIOS is a set of essential software routines that test hardware at startup, launch the operating system, and support the transfer of data among hardware devices. The BIOS is stored in read-only memory and is executed when the computing device 104 is activated.

When the computing device 104 is in operation, the processor 210 executes software stored in memory 250, communicates data to and from memory 250, and generally controls operations of the coupled input/output devices pursuant to the software. The script generator 270, the static-timing engine 280, the operating system, and any other applications are read in whole or in part by the processor 210, buffered by the processor 210, and executed.

When the script generator 270 is implemented in software, as shown in FIG. 2, it should be noted that the script generator 270 can be stored on any computer-readable medium for use by or in connection with any computer-related system or method. In the context of this document, a computer-readable medium is an electronic, magnetic, optical, or other physical device or means that can contain or store a computer program for use by, or in connection with a computer-related system or method. The computer-readable medium can be, for example but not limited to, an electronic, magnetic, optical, electromagnetic, infrared, or semiconductor system, apparatus, device, or propagation medium.

Figure 3:
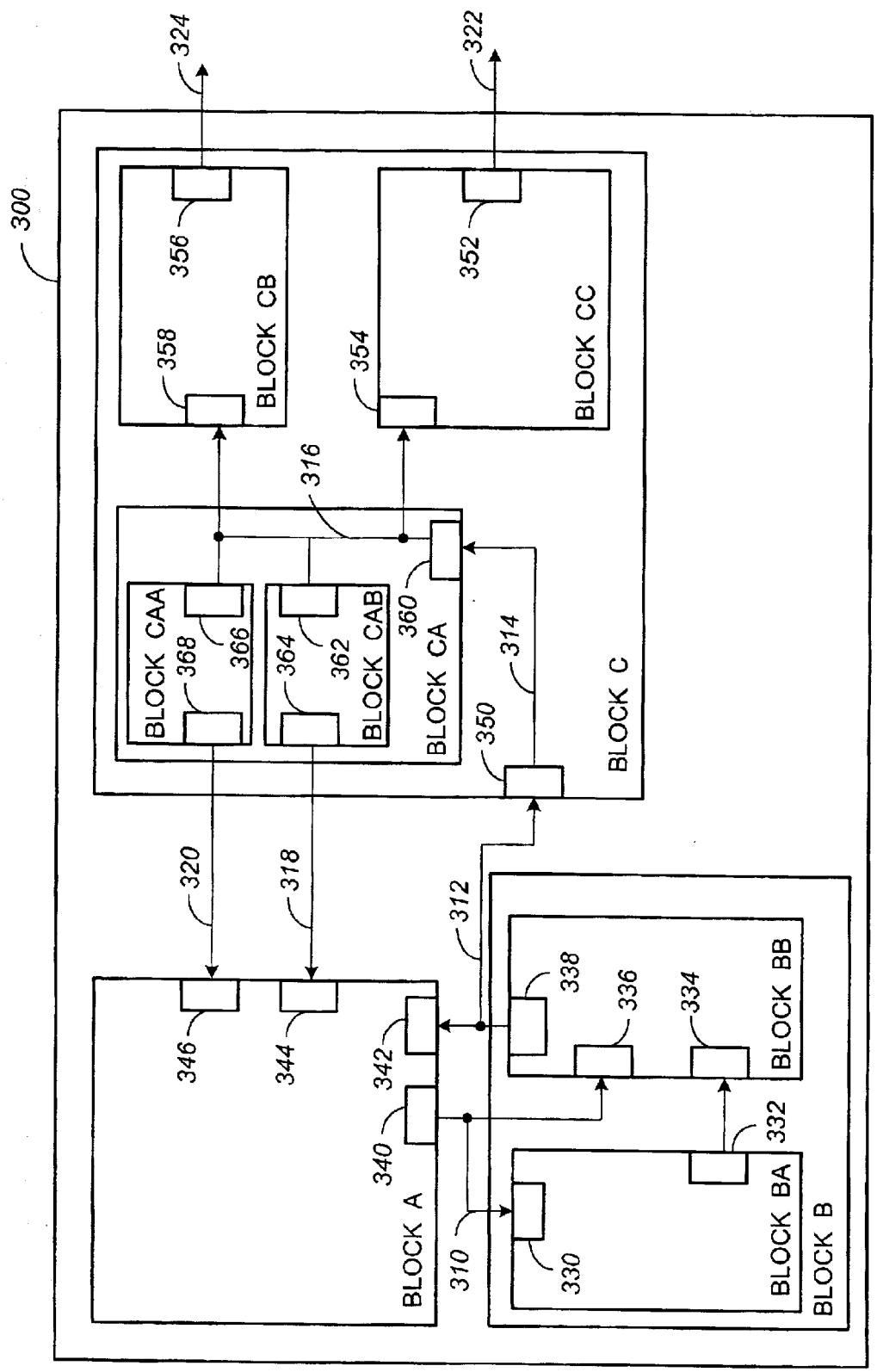
FIG. 3 is a schematic diagram of a hierarchically arranged integrated circuit that can be designed and analyzed with the integrated circuit design system of FIG. 1.

The block diagrams and schematic presented in FIGS. 3 and 4 are provided to illustrate and describe the aspects of computer-aided circuit design that are pertinent to the present invention. In this regard, FIG. 3 shows that an integrated circuit may be arranged and modeled with a plurality of separately defined functional blocks arranged and coupled in a hierarchical fashion across the integrated circuit. FIG. 4 illustrates the importance of tightly coordinating the relative timing between clock and data signals across an integrated circuit.

FIG. 3 is a block diagram illustrating an integrated circuit representation 300 that may be generated via one or more of the general-purpose computers 104 in a computer-aided design tool. The integrated circuit representation 300 illustrated in FIG. 3 is grossly oversimplified for ease of illustration and discussion of aspects pertinent to the scope of the invention. It should be understood that VLSI circuits may contain tens to hundreds of millions of transistors and other various functional components. It should be further understood that an integrated circuit at that level of integration may be designed by individual circuit designers and/or by teams of circuit designers tasked with developing component arrangements to meet various functional and timing specifications. Thus, functional divisions or blocks may be assigned to various circuit designers or teams to design separate portions of the integrated circuit.

In this regard, the integrated circuit representation 300 includes circuit blocks labeled, A, B, and C. Circuit blocks A, B, and C may each contain circuitry configured to perform one or more designated functions for one or more time varying input signals. The circuit blocks A, B, and C may also be configured with appropriate conductors to forward output signals to each other and in some cases to destinations other than those on the integrated circuit 300. Circuit blocks A, B, and C are representative of a first level of the overall integrated circuit representation 300.

As shown in FIG. 3, circuit blocks B and C contain other circuit blocks. For example, circuit block B contains circuit blocks BA and BB. Circuit blocks BA and BB may be alternatively described as child blocks (of the parent level block B) or second-level blocks. In this regard, the child or second-level blocks BA and BB are hierarchically arranged above the first level of the integrated circuit 300. Circuit block C contains child or second-level blocks CA, CB, and CC. In addition, block CA further includes child or third-level blocks CAA and CAB.

Circuit blocks may both receive and/or send time varying signals to or from other circuit blocks via various conductors. These input and output signals may traverse functional blocks at the same hierarchical level (e.g., the first, second, and third levels, respectively), as well as traverse different hierarchical levels (e.g., between the third and the first levels). For example, conductor 310 connects circuit block A with circuit block B at the first hierarchical level. Circuit block B is also coupled to circuit blocks BA and BB at the second hierarchical level. Conversely, conductor 320 connects circuit block CAA with circuit block A thus coupling the third hierarchical level to the first hierarchical level.

For simplicity of illustration and description, the integrated circuit representation 300 omits respective ports at the intersection of conductors and the border of each functional block at the each hierarchical levels. For example, ports are not illustrated at the intersection of block CA and block C. It should be understood, that each functional block can be modeled by the conductors (inputs and outputs) that traverse the border of the functional block at one or more hierarchical levels. In other words, conductor 318 may be modeled by adding both an input and an output port within block CA and an input and an output port within block C in addition to port 364 and port 344.

Furthermore, the integrated circuit representation 300 illustrates only three levels of hierarchy. It should be further understood that more or fewer levels of hierarchy are contemplated and may be modeled and analyzed in the contemplated system. Moreover, the contemplated system may be programmed to model and analyze each possible level to level interconnection, in a multi-level hierarchically arranged integrated circuit.

At one level of abstraction, circuit block A can be modeled or described by output port 340 and inputs ports 342, 344, and 346, and the various internal circuits (not shown) that may be coupled to the ports. As illustrated in FIG. 3, each of the separate ports 340, 342, 344, and 346 may be modeled at the interface of circuit block A. Similarly, circuit block B can be modeled by input port 330 and output port 338 and the various internal circuits (not shown) that may be coupled to the ports. In addition, circuit B can be modeled at a second level of abstraction that may account for output port 332, input ports 334 and 336, as well as the various internal circuits of blocks BA and BB, respectively. It should be understood that circuit block C, among other circuit blocks not illustrated, can be similarly represented at various levels of abstraction.

After each of the various circuit blocks A, B, and C have been appropriately modeled at a particular level of abstraction (i.e., level of interest), the integrated circuit representation 300 can be modeled by identifying and modeling each of the conductors that carry signals both to and from each of the circuit blocks. For example, circuit blocks A and B are connected between ports 340, 330, and 336 by conductor 310 and between ports 342 and 338 by conductor 312. Circuit blocks B and C are connected between ports 338 and 350 by conductor 312. Circuit blocks C and A are connected between ports 364 and 344 by conductor 318 and between ports 368 and 346 by conductor 320.

Circuit block C is configured to receive signals applied to conductor 312 at port 350. Conductor 314 couples port 350 to port 360 located within block CA. Conductor 316 couples port 360 to ports 354, 358, 362, and 366 located within circuit blocks CAB, CAA, CC, and CB, respectively. Circuit block CC provides a first output signal to one or more devices off the integrated circuit 300 via port 352 and conductor 322. Similarly, circuit block CB provides a second output signal via port 356 and conductor 324.

Figure 4A:
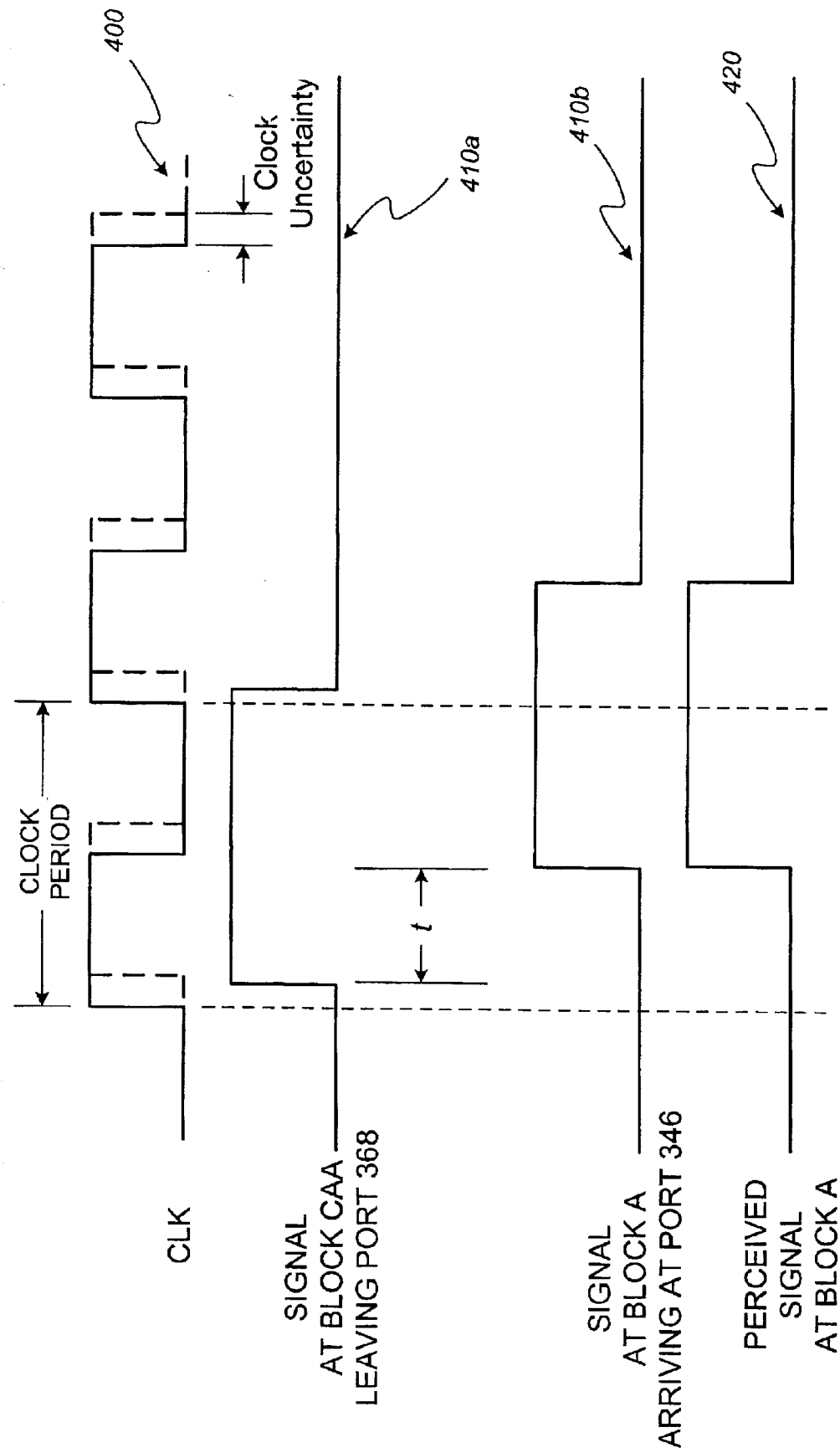

The upper-most three of the four signals illustrated in FIG. 4A represent a clock signal and a time-varying voltage signal that may be expected to be observed at the indicated locations within the integrated circuit representation 300 of FIG. 3 (if the representation were manufactured). The upper-most time-varying signal 400 is representative of a clock signal that may be distributed to and throughout each of the functional blocks of the integrated circuit. For the purposes of this discussion, it is assumed that the clock distribution scheme applies the clock signal uniformly throughout the entire integrated circuit. Stated another way, it is assumed that for a circuit configured to respond to the leading edge of the clock signal that the leading edge arrives at each component across the integrated circuit at the same time. Despite the assumption, the clock signal 400 may be modeled over time by the sum of the representative signal trace and a clock uncertainty. Note that clock uncertainty can be both positive and negative and represents the amount of time that may elapse relative to a particular clock cycle event. In other words, if the clock uncertainty value is 150 picoseconds (psec.) the leading edge of the clock signal may arrive at a particular point in the integrated circuit within (i.e., before or after) 150 psec. of a desired time.

The next time-varying signal 410a is a representative signal observed exiting port 368 from circuit block CAA along conductor 320 (see FIG. 3). Thereafter, FIG. 4A presents the representative signal 410a as it might be observed at port 346 of circuit block A (see FIG. 3). Note that while the time-varying plots indicate that the general shape of the time-varying signal 410a that exits circuit block CAA will be the same when it arrives at circuit block A, the received signal is shifted by time, t, such that the signal arrives at a different relative time within the clock period.

FIG. 4B highlights a signal-timing error attributable to the time, t, when t approximates the duration of the clock period. As in FIG. 4A, the upper-most time-varying signal illustrated in FIG. 4B is representative of a clock signal that may be distributed to and throughout each of the functional blocks of the integrated circuit. The next time-varying signal 430a is a representative signal observed exiting port 368 from circuit block CAA along conductor 320 (see FIG. 3). Thereafter, FIG. 4B presents the representative signal 430a as it might be observed at port 346 of circuit block A (see FIG. 3). As with the time-varying signals illustrated in FIG. 4A, the general shape of the time-varying signal 430a that exits circuit block CAA will be the same when it arrives at circuit block A, the received signal is shifted by time, t, such that the signal arrives at a different relative time within the clock period. When, as shown in FIG. 4B, time, t, approximates the duration of the clock period, there is an increased likelihood that the perceived signal 440 at block A will fail to reflect the time-varying nature of the signal transmitted from port 368.

Note that for integrated circuits configured to trigger on a leading (i.e., rising) edge of a clock signal transition, the registered or perceived time-varying signal 430b at port 346 of circuit block A may be interpreted as not varying within the clock period as shown by the non-varying signal 440 perceived at port 346 of circuit block A. Because the perceived signal 440 is sampled when the when the clock signal is low (or has yet to transition above a voltage level indicative of a rising or leading edge) the perceived signal 440 does not vary in time over the duration illustrated in FIG. 4B. A goal of static-timing tests is to identify circuit paths that exhibit signal-timing errors and to identify circuit paths that have a high probability of such failures.

The time, t, includes multiple components. Referring back to FIG. 3, a signal that traverses conductor 320 may be described by the following durations: a first travel duration between a source element within block CAA and the border of block CAA; a second travel duration from the border of block CAA to the border of block CA; a third travel duration from the border of block CA to the border of block C; a fourth travel duration from the border of block C to the border of block A; and a fifth travel duration from the border of block A to a destination element within block A. Those having ordinary skill in the art will understand that both the total time, t, that a signal takes to traverse the conductor 320, as well as the clock signal uncertainty and transition time will affect the time at which a signal will be perceived at a destination element within the integrated circuit.

For leading edge triggered logic circuits, a clock signal transition time is the amount of time that it takes the clock signal to charge a capacitive load coupled to the clock signal to a voltage level that is perceived or registered as a rising clock signal transition by circuit elements coupled to the clock signal. Conversely, for falling edge triggered logic circuits, a clock signal transition time is the amount of time that it takes the clock signal to discharge a capacitive load coupled to the clock signal to a voltage level that is registered as a falling clock signal transition by circuit elements coupled to the clock signal.

Layout information identifying conductor geometry (i.e., the length and width of each line segment) can be applied to an integrated circuit model to establish expected signal travel times between each functional block border by determining expected relative signal arrival and departure times (with respect to a clock signal event, such as a rising edge) at respective port pairs along a conductor. For example, layout information can be used to determine the length, width, and depth of each of the multiple paths of conductor 310. Each of the paths can then be modeled with appropriate resistance and capacitance values in a resistor-capacitor (RC) network.

Sentry registers may be introduced in proximity to ports 340, 330, and 336 (i.e., near the functional block borders) to facilitate the determination of a plurality of expected signal delay times between specific ports coupled to the conductor 310. For example, a sentry register (not shown) may be used to determine an expected time interval that will elapse while a signal that originates in a source register traverses the border of circuit block A. Sentry registers may be modeled as if each register has a zero capacitance value. In this way, signal delay times will not be increased (in the circuit simulation) by adding the sentry registers to the model 300.

A sentry register placed in proximity to port 330 may be used to determine when the signal that originated in a source register (not shown) of circuit block A can be expected to arrive at circuit block BA. A second sentry register (not shown) placed in proximity to port 336 can be used to determine when the signal that originated in the source register of circuit block A can be expected to arrive at circuit block BB. Thus, it should be understood that the model 300 provides a representation of internal processing time within an originating circuit block, a representation of signal delay time from the source circuit block to a destination circuit block, a signal delay time from the destination circuit block to higher level circuit blocks (e.g., blocks BA and BB), as well as an internal processing time within the ultimate destination circuit block.

Once a design team assigned to block BA receives an indication of when the signal that originated in circuit block A will arrive at circuit block BA (e.g., a timing constraint), the design team will be able to determine with greater certainty if the proposed design for the internal circuitry of functional block A will result in the signal arriving at the destination register within block BA within the allotted time. The time at which the signal traverses the border of circuit block A relative to the clock cycle is important as it impacts integrated circuit functions in circuit blocks BA and BB. Relative clock cycle positions can be used as timing constraints for distribution across the various functional blocks of the integrated circuit representation 300.

Timing constraints can indicate to circuit design teams the amount of time a signal takes to propagate from block to block. The amount of time a signal takes to traverse from block to block can be used by design teams to determine when a particular input signal will be available at a functional block. In addition, the amount of time a signal takes to traverse from block to block can be used by design teams to determine when a particular output signal will be sent. Consequently, design teams can work within the timing constraints assigned to their particular functional block to finalize their portion of the overall integrated circuit design independently from other design teams with a higher greater probability that the overall circuit will function as intended.

Operation

Figure 5:
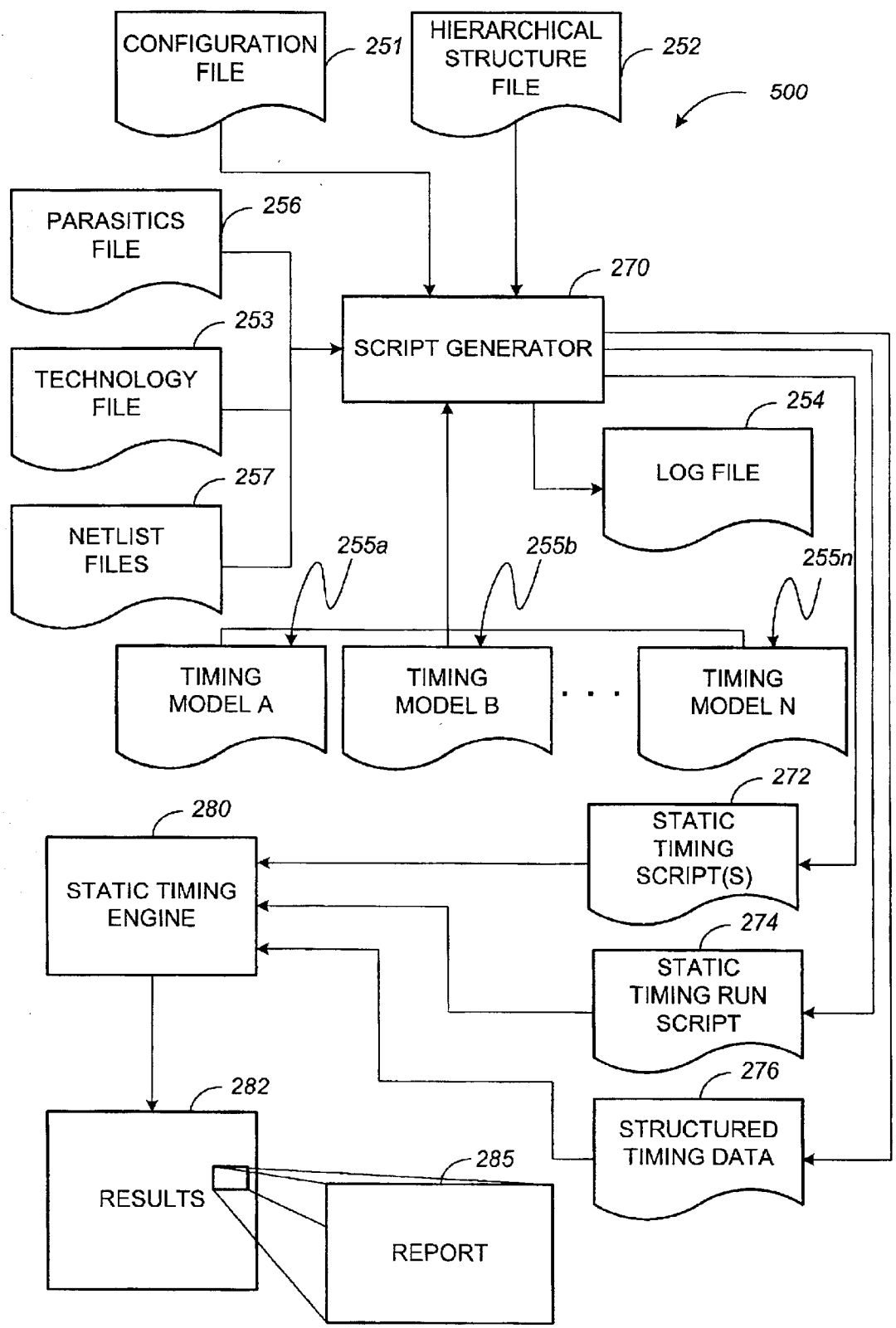
FIG. 5 is a functional block diagram illustrating a representative method for integrating multiple timing models in a static-timing analysis that can be implemented by the computing system of FIG. 4.

Reference is now directed to the functional block diagram of FIG. 5. The diagram 500 illustrates information flow from files within memory 250 (FIG. 2) to the script generator 270, which generates input scripts used by the static-timing engine 280 to perform a static-timing analysis of an integrated circuit design. The diagram 500 illustrates input files and models as well as output files that can be received, processed, and/or generated by the computing device 104 of FIG. 2. The script generator 270, operative within the computing device 104, is programmed to receive information from the configuration file 251, the hierarchical structure file 252, the parasitics file 256, the technology file 253, and one or more netlist files 257 describing a present model of the contemplated VLSI circuit. The script generator 270 is also programmed to receive and apply a plurality of timing models 255. Each of the timing models 255a, 255b, . . . , 255n will be used by the script generator 270 to identify and retrieve appropriate information from a knowledge base formed by the cumulative data contained in the aforementioned files.

The script generator 270 may create one or more static-timing scripts 272 responsive to the particular timing model selected for application in the static-timing analysis for each functional block of the integrated circuit design. In this regard, the configuration file 251 may include a schedule listing each functional block identified at a level of abstraction to be modeled and statically timed. Each record in the list may be associated with a particular timing model 255 that an integrated circuit designer desires to apply in a static-timing test run. Each of the separate timing models 255 may require a different set of data parameters to apply as inputs to the static-timing engine 280. For example, timing model A 255a may comprise a verilog® hardware description of a first functional block of interest. Verilog® is a registered trademark of the Gateway Design Automation Corporation, Littleton, Mass., U.S.A. Verilog® is a hardware description language used to design and document electronic systems. Verilog® allows designers to design at various levels of abstraction. By way of further example, timing model B 255b may comprise a child level verilog® description of a second functional block of interest associated with the first functional block of interest.

The configuration file 251 includes a host of options that may be selectively enabled by one or more integrated circuit designers. The options include a model load method (e.g., raw verilog®, extracted timing model, empty verilog® shell), the location of data for a particular functional block in the integrated circuit design knowledge base (e.g., an identifiable data storage device coupled to the network 102 (see FIG. 1), the creation of a local data folder and or file for static-timing test run logs, reports, errors, and the like, as well as one or more options for suppressing various error and warning messages. In addition the configuration file 251 may include an option to control data collection to a local "cubby" or data storage area coupled to the computing device 104. The script generator 270 uses data stored in the local "cubby" during the timing run as opposed to the data distributed throughout the knowledge base.

The hierarchical structure file 252 includes information that reflects the hierarchical relationships between the various functional blocks that form the integrated circuit design. The hierarchical structure file 252 includes an indicator that identifies a hierarchical status and location of each of the functional blocks. For example, block B (see FIG. 3) is identified as a parent level block, whereas blocks BA and BB are identified as child blocks of block B.

The one or more netlist files 257 contain information detailing the various conductors (and their connectivity) that traverse each of the various hierarchical levels across the integrated circuit design. As described above, the plurality of data files are used to formulate a hierarchically arranged model of the various signal paths that associate the various functional blocks of the integrated circuit design. Ultimately, the composite model describes signal timing (relative to a clock signal) for each signal that traverses each of the defined functional blocks of the integrated circuit. For a hierarchically arranged circuit, the static-timing engine 280 is applied over the various hierarchical levels to establish the timing constraints that the circuit designers of functional blocks should meet to ensure the intended operation of the circuit as a whole. The clock signal at each functional block is modeled by information that includes the clock period and clock signal uncertainty. Additional information may include clock and data signal transition limits.

The clock and data signal transition limits are determined by parasitics. Parasitics are defined in the parasitics file 256 for each net in the integrated circuit design. Parasitics include the set of resistance and capacitance values that may be applied to model various conductors and circuit elements used in the circuit design. A net is formed by the various conductors that integrate functional blocks at a specific hierarchical level in the circuit design. Parasitic annotations are applied to the ports of the next higher-level functional blocks. To simplify the model, parasitic information is not necessarily added to functional blocks that are two or more hierarchical levels removed from a specific hierarchical level of interest.

The script generator 270 identifies, retrieves, and assembles the information desired by each of the available timing models 255 in the static-timing scripts 272 and the structured timing data 276 based upon information in the configuration file 251 and the hierarchical structure file 252. Each of the static-timing scripts 272 and the structured timing data files 276 are generated in compliance with an input scheme that is accepted by the particular static-timing engine 280 selected to perform the static-timing analysis.

The script generator 270 can also be configured to produce an abstracted timing model, using an appropriate model extractor. The abstracted timing model, which is a type of timing abstraction that reduces the detailed information of a functional block modeled by verilog® to a model based upon a reduced number of timing arcs based upon mathematical models. A timing arc is a path in an integrated circuit that is timing relevant. A timing arc is defined by a startpoint and an endpoint generally formed by registers or latches and a conductor that forms the "path" in the integrated circuit between the startpoint and endpoint. A startpoint and an endpoint may be associated with multiple timing arcs depending on the particular circuit arrangement. This abstracted model can be used at a higher hierarchical level during a static-timing run. The script generator 270 can also produce another type of abstraction model that reduces the data size by removing internal timing arcs at a present hierarchical level of interest.

As further illustrated in the functional block diagram of FIG. 5, the script generator 270 is configured to create a static-timing run script 274. The static-timing run script 274 includes that information that the static-timing engine 280 uses to perform a complete static-timing analysis of the integrated circuit design.

In accordance with the selections indicated in the configuration file 251, the static-timing engine 280 produces test run results 282 which may include signal-timing errors, signal-timing warnings, a list of the functional blocks tested and the method used to model each respective block, as well as other information concerning the test run. As indicated in FIG. 5, the test run results 282 are configured to produce a report 285. The report 285 takes the form of a data file and includes information presented on a display device 230 associated with a computing device 104 on the network 102, and can be sent to a hard copy device such as a printer or a plotter associated with the network 102.

Figure 6:
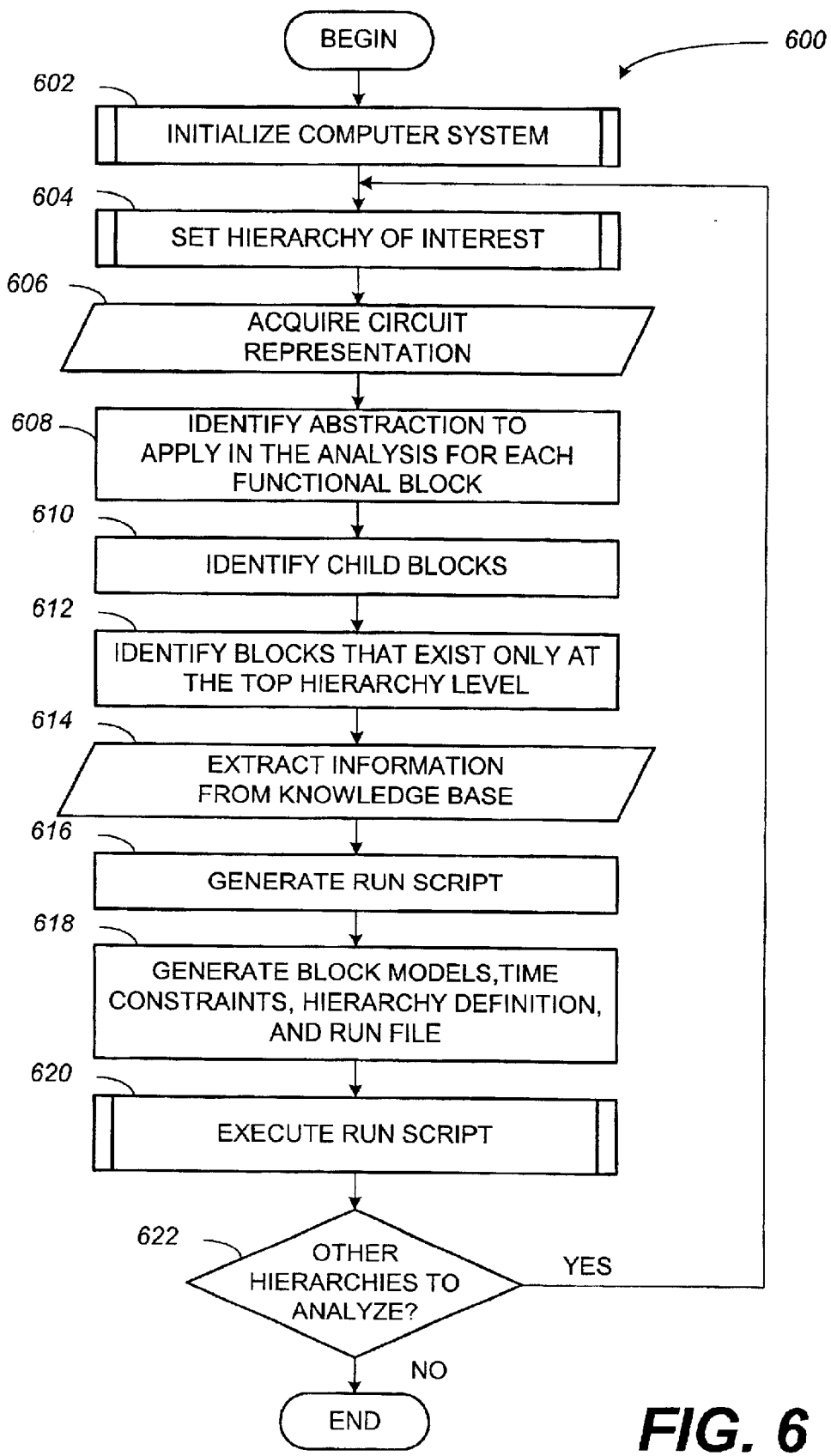
FIG. 6 is a flow diagram illustrating a representative method for automating a static-timing analysis.

FIG. 6 is a flow diagram illustrating a representative method 600 for automating a static-timing analysis of an integrated circuit representation such as the integrated circuit representation 300 of FIG. 3. As illustrated in the flow diagram, a computing device 104 configured to implement the method 600 for automating a static-timing analysis may begin by initializing the system. Step 602 may include loading a plurality of model (i.e., data) files. These files may include the configuration file 251, previously generated timing models 255, netlist files 257, technology file 253, and the parasitics file 256, among others. As described above, the plurality of data files are used to formulate a hierarchically arranged model of the various signal paths that associate the various functional blocks of the modeled circuit. Ultimately, the model describes signal timing (relative to a clock signal) for each signal that traverses each of the defined functional blocks of the modeled circuit.

For a hierarchically arranged circuit, the static-timing engine 280 is applied over the various hierarchical levels to ensure the intended operation of the circuit at that level of abstraction. The level of abstraction can be as fine as a detailed verilog® representation with associated parasitics or as coarse as an abstracted timing model 255 generated and stored during an extraction/static-timing run at a lower hierarchical level. Abstracted timing models 255 reduce the complexity of the static-timing analysis by removing timing arcs from the circuit representation. These abstracted models 255 allow the static-timing analysis to be completed in less time using less memory than would otherwise be possible.

The configuration file 251 and the hierarchical structure file 252 provide flexibility that allows easy adjustment of both the hierarchical level of interest, as well as the composition (i.e., level of abstraction) of the hierarchical level and functional blocks being tested. The clock signal at each functional block may be modeled by information that includes the clock period and clock signal uncertainty. Additional information may include clock and data signal transition limits. Next, as shown in step 604, the computing device 104 is programmed to prompt the user to set a hierarchy level of interest.

Once the system has been initialized and the hierarchy level of interest identified in steps 602 and 604, the computing device 104 can acquire any previously designed and stored block-level circuit representations (e.g., timing models 255), as indicated in step 606. Note that the block-level circuit representations can include timing models 255 of various levels of abstraction including a previously completed circuit designs. Thereafter, in step 608, the computing device 104 identifies the level of abstraction to use for each functional block at the hierarchical level of interest. The computing device 104, having identified the signal interfaces, can then identify child blocks as shown in step 610.

Next, in step 612, the computing device 104 is programmed to identify functional blocks that exist only at the top hierarchy level in the integrated circuit design. Thereafter, as indicated in step 614, the computing device 104 is programmed to extract the necessary knowledge to statically time the integrated circuit representation in the designated static-timing engine 280.

In steps 616 and 618, the computing device 104 is programmed to generate a run script 274 and the block timing models 255, time constraints, and other information that may be applied in the static-timing scripts 272, respectively. The computing device 104 receives relative timing information for signal interfaces as described above with regard to the representative circuit 300 illustrated and described FIG. 3. The computing device 104 applies the relative timing information to the identified interfaces conveyed in the configuration file 251 and the one or more netlists 257 to generate timing constraints that are associated with each functional block of the contemplated circuit design. It should be understood that timing constraints may be generated and associated with each input signal that enters a functional block, as well as with each output signal that exits a functional block. The timing constraints, which may be defined as a relative portion of a clock signal cycle, may be stored in memory 250 (FIG. 2) and/or communicated to each of the identified functional block designers.

In addition, the timing constraints may be forwarded for application in a rules checker (not shown). The rules checker may include logic configured to prevent a circuit designer and/or a circuit design team from storing a proposed circuit design that fails to meet one or more design criteria. Note that the design criteria applied by the rules checker may include information regarding actual clock buffer placement throughout the contemplated circuit (in lieu of designing the circuit under the assumption that the clock signal reaches each functional block across the circuit at the same time). The rules checker may produce a time budget or schedule that describes signal-timing relationships at the functional block borders.

Once the static-timing run script 274 and the static-timing scripts 272 are generated in steps 616 and 618, the computing device 104 is programmed to execute the static-timing run script 274 as indicated in step 620. After the static-timing test run has completed the analysis at the present hierarchy of interest, the computing device may be programmed to query a circuit designer or other interested party whether there are other hierarchies of the integrated circuit design to analyze as illustrated in step 622. When the response to the query of step 622 is affirmative, as indicated by the flow control arrow labeled, "yes," the computing device 104 may be programmed to repeat steps 604 through 620 as may be desired. Otherwise, the method 600 for automating a static-timing analysis of an integrated circuit representation may terminate.

Figure 7:
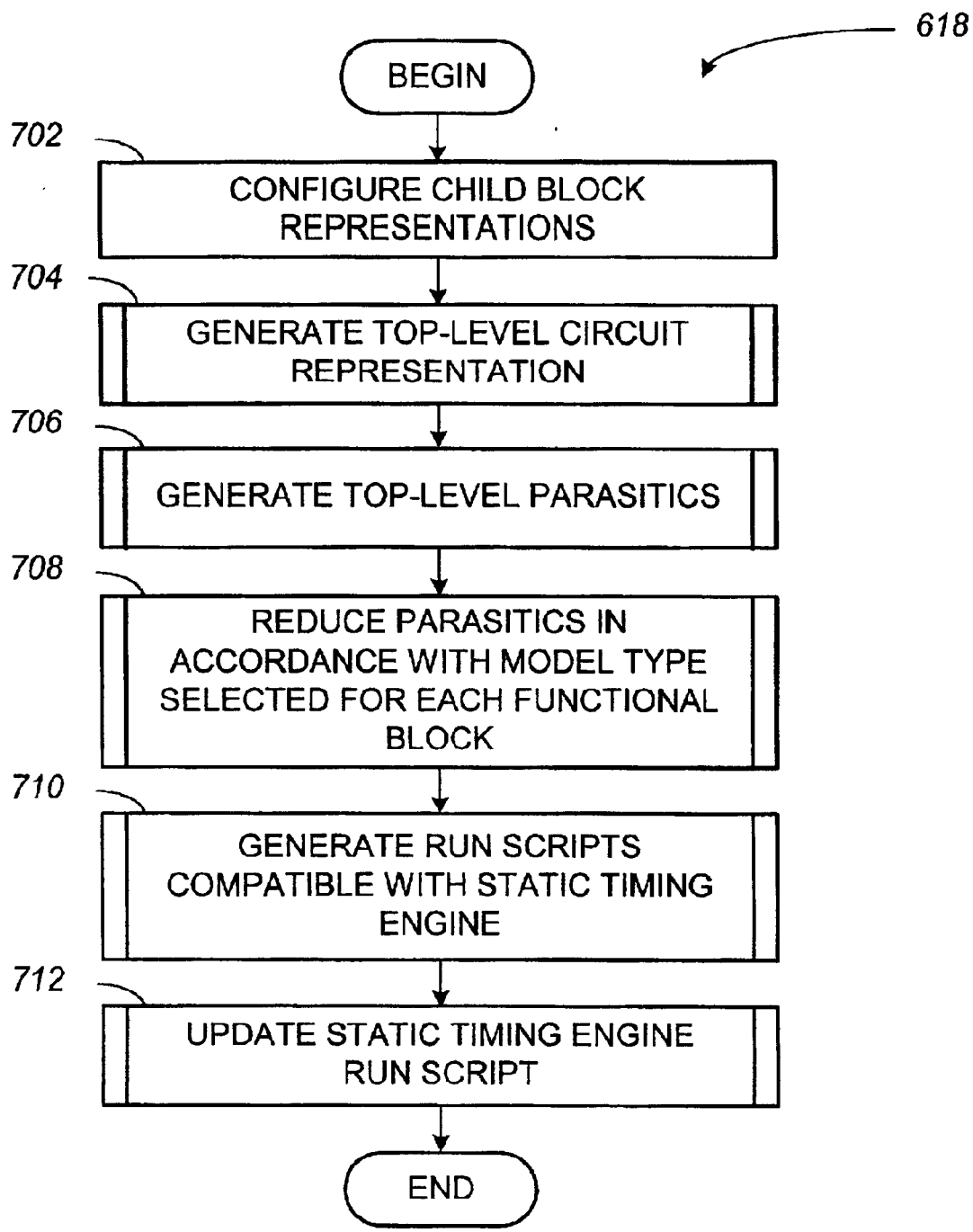
FIG. 7 is a flow diagram illustrating execution of the run script of FIG. 6.

FIG. 7 is a flow diagram illustrating generation of the run script of FIG. 6. As illustrated in the flow diagram, a computing device 104 configured to store logic programmed to implement the method 600 for automating a static-timing analysis may be programmed to perform the following steps to generate functional block timing models, time constraints, a hierarchy definition, and a static-timing run script (step 618). In step 702, the computing device 104 is programmed to configure one or more child block representations or timing models 255 for each identified child block. Thereafter, in step 704, the computing device 104 is configured to generate a top-level circuit representation. The computing device 104 uses the top-level circuit representation to generate the top-level parasitics as indicated in step 706.

Next, in step 708, the computing device 104 is programmed to reduce the parasitics in accordance with the particular timing model type selected for the functional block of interest. In step 710, the computing device 104 is configured to generate run scripts 272 compatible with the static-timing engine 280. In step 712, the computing device 104 may be configured to generate and or otherwise modify a static-timing engine run script 274 in accordance with steps 702 through 710 described above.

Any process descriptions or blocks in the flow diagrams of FIGS. 6 and 7 should be understood as representing modules, segments, or portions of code which include one or more executable instructions for implementing specific logical functions or steps in the process for time-budgeting an integrated circuit. Alternate implementations are included within the scope of the preferred embodiment of the present invention in which functions may be executed out of order from that shown or discussed, including substantially concurrently or in reverse order, depending on the functionality involved, as would be understood by those reasonably skilled in the art of the present invention.

The detailed description has been presented for purposes of illustration and description. It is not intended to be exhaustive or to limit the invention to the precise forms disclosed. Modifications or variations are possible in light of the above teachings. The embodiment or embodiments discussed, however, were chosen and described to provide the best illustration of the principles of the invention and its practical application to enable one of ordinary skill in the art to utilize the invention in various embodiments and with various modifications as are suited to the particular use contemplated. All such modifications and variations, are within the scope of the invention as determined by the appended claims when interpreted in accordance with the breadth to which they are fairly and legally entitled.

Therefore, having thus described the invention, at least the following is claimed:

1. A circuit design system, comprising:
    a network coupled to a plurality of data storage devices, the data storage devices containing a knowledge base that defines an integrated circuit design;
    a computer coupled to the network, the computer including logic for receiving information defining an integrated circuit representation from the plurality of data storage devices; and
    a memory element associated with the computer, the memory element configured to store logic, the logic configured to generate one or more static-timing scripts that reflect a plurality of timing models responsive to one or more sentry registers inserted along conductors that traverse a boundary of a functional block within the circuit design and the expected signal timing behavior of a signal that traverses the conductor, the logic further configured to generate a static timing run script and structured timing data, wherein the static timing scripts, the static timing run script, and the structured timing data are forwarded to a static timing engine for execution.

2. The system of claim 1, wherein the knowledge base comprises a netlist, the netlist describing the relative placement of a plurality of functional blocks.

3. The system of claim 2, wherein the knowledge base comprises a hierarchical relationship between the plurality of functional blocks.

4. The system of claim 2, wherein the netlist comprises a plurality of ports.

5. The system of claim 4, wherein the netlist comprises conductors that traverse the ports.

6. The system of claim 4, wherein the netlist describes a path traversed by the conductor between the ports.

7. The system of claim 2, wherein the logic is configured to generate a run script configured to execute a static-timing engine.

8. The system of claim 7, wherein the run script includes information that controls the format of the data generated by the static-timing engine.

9. The system of claim 2, wherein the logic is responsive to a configuration file.

10. The system of claim 9, wherein the data generated by the static-timing engine is suppressed.

11. The system of claim 9, wherein the configuration file comprises a timing model identifier.

12. The system of claim 9, wherein the configuration file comprises a circuit information load identifier.

13. The system of claim 1, wherein at least one of the plurality of timing models a quantity of timing arcs that is less than the number of timing arcs identified in an abstraction of the corresponding functional block.

14. The system of claim 1, wherein at least one of the plurality of timing models comprises a subset of timing arcs internal to the functional block.

15. The system of claim 1, at least one of the plurality of timing models comprises timing arcs that traverse the functional block.

16. A method for automating static-timing analysis of an integrated circuit representation, the method comprising the steps of:
    acquiring circuit information, the circuit information comprising a plurality of functional blocks and a plurality of conductors coupling the functional blocks, wherein the functional blocks are modeled by a subset of the plurality of conductors, a respective subset defined by those conductors that traverse a border of each respective functional block;
    identifying a timing model to apply to each of the plurality of functional blocks responsive to at least one sentry register inserted along a conductor at the boundary of a functional block and the expected signal timing behavior of a signal that traverses the conductor;
    defining the hierarchical relationships between each of the plurality of functional blocks;
    extracting the circuit information responsive to the identifying and defining steps to complete a simulation of each of the plurality of functional blocks; and
    forwarding one or more static-timing scripts, a static timing run script, and structured timing data to a static-timing engine.

17. The method of claim 16, wherein the circuit information comprises a relative position of the functional blocks.

18. The method of claim 16, wherein the circuit information comprises a plurality of ports, the ports defining a relative position of each of the conductors that traverse the border of a particular functional block.

19. The method of claim 16, wherein the step of identifying comprises setting a parameter in a configuration file.

20. The method of claim 16, wherein the step of defining comprises a hierarchical structure file.

21. The method of claim 20, wherein one of the plurality of functional blocks comprises a child block.

22. The method of claim 16, wherein the step of extracting is responsive to an indicator in a configuration file that identifies the location of the information associated with each functional block.

23. The method of claim 16, wherein the step of extracting is responsive to a timing model associated with each functional block.

24. The method of claim 23, wherein the timing model comprises a quantity of timing arcs that is less than the number of timing arcs identified in an abstraction of the corresponding functional block.

25. The method of claim 23, wherein the timing model comprises a timing arc internal to the functional block.

26. The method of claim 25, wherein the timing model comprises a timing arc that traverses the functional, block.

27. A computer-readable medium having a program for automatically configuring a static-timing engine to statically time an integrated circuit design, the program comprising:

logic configured to receive a representation of the integrated circuit at a functional block level;

logic configured to identify hierarchical relationships between a plurality of functional blocks of interest;

logic configured to identify each of a plurality of conductors that traverse a border of the functional blocks of interest;

logic configured to model the plurality of conductors by inserting a sentry register at a location where the conductor traverses a border of a functional block and the expected signal timing behavior of a signal that traverses the conductor;

logic configured to generate a plurality of static-timing scripts, a static timing run script, and structured timing data, the static-timing scripts configured to populate a plurality of timing models, each of the timing models configured to simulate the operation of a corresponding functional block; and logic configured to forward the plurality of static-timing scripts, the static timing run script, and structured timing data to a static timing engine.

28. The computer-readable medium of claim 27, wherein the logic configured to generate a plurality of static-timing scripts extracts information from a knowledge base distributed across a network.

29. The computer-readable medium of claim 28, wherein the knowledge base comprises a configuration file.

30. The computer-readable medium of claim 28, wherein the knowledge base comprises a hierarchical structure file.

31. A computer aided circuit design tool, comprising:

means for acquiring a representation of an integrated circuit;

means for communicating hierarchical relationships within the representation at a functional block level;

means for identifying which of a plurality of interchangeable timing models should be applied in a static-timing analysis of the integrated circuit, wherein each of the interchangeable timing models is responsive to at least one sentry register inserted along a conductor at the boundary of a functional block and the expected signal timing behavior of a signal that traverses the conductor;

means for populating each of the interchangeable timing models; and means for forwarding a plurality of static-timing scripts, a static timing run script, and structured timing data to a static timing engine.

32. A method for generating a run script configured to automate a static-timing analysis of an integrated circuit representation using a static timing engine, the method comprising the steps of:

configuring child block representations associated with each child block associated with a functional block of interest;

generating a top-level circuit representation responsive to at least one sentry register inserted along a conductor at the boundary of the functional block of interest and the expected signal timing behavior of a signal that traverses the conductor;

applying parasitic values to the top-level circuit representation; and translating information stored in an integrated circuit knowledge base into a format compatible with a static timing engine, the format comprising one or more static timing scripts, a static timing run script, and structured timing data.

33. The method of claim 32, wherein the step of configuring comprises identifying a timing model to apply for each of the child block representations.

34. The method of claim 33, wherein the timing model is selected from a plurality of interchangeable models.

35. The method of claim 33, wherein the step of configuring comprises setting a first parameter in a file.

36. The method of claim 33, wherein the step of configuring is responsive to a hierarchical structure file.

* * * * *